United States Patent [19]

Magome

[11] Patent Number: 5,497,352
[45] Date of Patent: Mar. 5, 1996

[54] SEMICONDUCTOR MEMORY DEVICE HAVING DUAL MODE OPERATION

[75] Inventor: Koichi Magome, Hiratsuka, Japan

[73] Assignee: Kabushiki Kaisha Toshiba, Kawasaki, Japan

[21] Appl. No.: 371,604

[22] Filed: Jan. 12, 1995

Related U.S. Application Data

[63] Continuation of Ser. No. 918,030, Jul. 24, 1992, abandoned.

[30] Foreign Application Priority Data

Jul. 24, 1991 [JP] Japan ..................... 3-184810

[51] Int. Cl.⁶ ................... G11C 7/00; G11C 8/00
[52] U.S. Cl. ............... 365/230.03; 365/189.01; 365/230.06; 365/238.5
[58] Field of Search .................. 365/230.03, 218, 365/230.06, 227, 238.5, 189.01

[56] References Cited

U.S. PATENT DOCUMENTS

| | | | |
|---|---|---|---|
| 4,567,578 | 1/1986 | Cohen et al. | 365/238.5 |
| 4,807,189 | 2/1989 | Pinkham et al. | 365/189.05 |
| 5,003,510 | 3/1991 | Kamisaki | 365/230.03 |
| 5,109,361 | 4/1992 | Yim et al. | 365/218 |
| 5,134,589 | 7/1992 | Hamano | 365/218 |
| 5,155,705 | 10/1992 | Goto et al. | 365/218 |
| 5,229,971 | 7/1993 | Kiryu et al. | 365/230.03 |

Primary Examiner—Do Hyun Yoo
Assistant Examiner—Son Dinh
Attorney, Agent, or Firm—Foley & Lardner

[57] ABSTRACT

An improvement of a semiconductor memory device capable of designating a block write mode in which writing is effected simultaneously to a plurality of memory cells unitized by predetermined numbers and connected respectively to a plurality of column lines. Data lines correspond to a predetermined number of memory cells. The data lines and the column lines are selectively connected to each other by switches. During a block write mode, a predetermined number of column lines are simultaneously connected to the data lines corresponding thereto. During the other mode, a control unit controls the switches to connect some of the predetermined number of column liens to the data lines corresponding thereto. During the mode other than the block write mode, only a part of the predetermined number column lines are connected to the data lines, thereby reducing electric power consumption.

21 Claims, 6 Drawing Sheets

SEMICONDUCTOR MEMORY DEVICE HAVING DUAL MODE OPERATION

This application is a continuation of application Ser. No. 07/918,030, filed Jul. 24, 1992, now abandoned.

BACKGROUND OF THE INVENTION

1. Field of the Invention

The present invention relates generally to a semiconductor memory device incorporating a block write function and, more particularly, to a semiconductor memory device for use as an image memory.

2. Related Background Art

Generally, DRAM is often employed as a random-access module (hereinafter abbreviated to RAM module) of an image memory. The RAM module is available as a frame buffer for storing display-oriented data, and a high-speed data rewrite function is therefore required of this RAM module. One of functions which meet this demand may be a block write mode.

A known memory adopting the block write mode is disclosed in U.S. Pat. No. 4,807,189. The arrangement according to this patent is such that when the block write mode is designated by a signal level pattern given to a plurality of specific pins, a plurality of bit lines are simultaneously activated; and the write data are imparted from a data line connected in common to these bit lines.

According to this construction, however, the data line common to the plurality of bit lines is single, and hence it is impossible to freely select whether or not the data are written per column. For this reason, a specified pattern cannot be written.

An improvement in view of such consideration is a device including data lines corresponding to the respective columns. More specifically, a plurality of data lines are provided corresponding to the bit lines of the plurality of unitized columns, and the bit lines are made conductive to the plurality of data lines per unit column.

For instance, a 4-column block write mode is often-used as a typical block write. In this mode, the data are simultaneously written to the four columns irrespective of values of low-order 2 bits A1 A0 of column addresses A8 A7 . . . A1 A0 of the RAM module. Note that selective masking (no data is written) can be performed per I/O bit or column in the block write mode.

FIG. 6 illustrates a semiconductor memory device capable of the above-mentioned 4-column block write. It is assumed that the RAM module of the illustrated semiconductor memory device has 512 columns Ci (i=0, . . . 511). A DQ buffer 40 for linking the RAM module to the peripheral circuits is capable of transferring the data from the RAM module to an output buffer 50 disposed in the peripheral portion while amplifying the data as well as writing the data from a write buffer 20 disposed in the peripheral portion to the RAM module while amplifying the data. The write data is given from the write buffer 20 through a write data line 25 to the DQ buffer. The DQ buffer 40 drives data lines DQ0, DQ1, DQ2 and DQ3. The data lines are generally complementary lines and are arranged in a 2-line set in many cases. Referring to FIG. 6, for simplicity, the data lines are illustrated in the form of a single line. Referring again to FIG. 6, four sets of data lines DQi (i=0, . . . 3) are connected to the DQ buffer 40. Masking must be executable independently with respect to four columns during the block write mode.

When the column addresses A8 A7 . . . A1 A0 are transferred to a column address buffer 30, the column address buffer 30 generates inverted signals $\overline{Ai}$ of the respective bits Ai (i=0, . . . 8) of the column addresses. High-order 7-bit signals Aj (j=2, . . . 8) of the column addresses and inverted signals $\overline{Aj}$ thereof are transmitted to a column decoder module CD. Transmitted to the DQ buffer 40 are remaining low-order 2-bit signals Aj (j=0, 1) and inverted signals $\overline{Aj}$ thereof. The column decoder module is constructed of 128 pieces of column decoders CDi (i=0, . . . 127). Each of the column decoders CDi consists of, as illustrated in FIG. 7, e.g., a NAND circuit and inverter circuits. On the basis of seven signals Xi (i=2, . . . 8), the column decoder CDi generates a signal for selecting a single column selection line CSLi. Each of the signals Xi (i=2, . . . 8) represents a bit value Ai of the column address or its inverted value $\overline{Ai}$.

When the column decoder module CD selects one column selection line, e.g., CSL0 among 128 column selection lines CSL0, . . . CSL127 in that manner, an electric potential of the column selection line CSL0 is high, thereby turning ON transfer gate transistors T0, T1, T2, T3. If columns C0, C1, C2, C3 are not masked, the write data transferred from the DQ buffer 40 through the data lines DQ0, DQ1, DQ2, DQ3 are written respectively to memory cells of the columns C0, C1, C2, C3 of the RAM module. Incidentally, if there exists a column to be masked, and when this column to be masked is, e.g., C1, the write data is not transferred from the DQ buffer 40 to the data line DQ1, and it follows that no data is written in the memory cells of the column C1.

Next, an explanation of the operation during a typical 1-bit read/write mode is given. In the case of the 1-bit read/write, as a matter of course, all the bits are given to the column addresses. However, the column selection lines are, as described above, arranged corresponding to the block write. Therefore decoding is performed only with the column addresses A8 A7 . . . A2 exclusive of the low-order 2 bits. For this reason, in the case of a read mode, if the column line selecting lines CSLj (j=0, . . . 127) are selected, the data of four columns C4j, C4j+1, C4j+2, C4j+ corresponding thereto are read respectively to four sets of data lines DQ0, DQ1, DQ2, DQ3. Then, the DQ buffer 40 effects decoding with respect to the remaining low-order 2-bit column addresses. Only the data for one column are read to a read data line 45.

Furthermore, in the case of a write mode, the data from a write data line 25 are supplied to the DQ buffer 40, wherein low-order 2-bit decoding is carried out. The write data are transferred to only one set of data lines among four sets of data lines DQ0, DQ1, DQ2, DQ3. The data are further written to the memory cell corresponding to the column selection line selected based on the column addresses excluding the low-order 2 bits. Eventually, the memory data are read with respect to sets of data lines corresponding to nonselected remaining 3 columns because of the column selection lines being employed in common.

In the conventional semiconductor memory device, the originally required data is only 1 bit in the case of the 1-bit read/write, and yet the single column selection line is arranged corresponding to the four columns. Hence, the excessive data for three columns are read to the data lines. Similarly, in an 8-column block write, the excessive data for an extra seven columns are read.

The data lines are, as stated earlier, typically arranged in pairs of two lines each. During a period for which no data is supplied, the data lines assume the same electric potential.

When data are supplied, one data line is charged or discharged, resulting in a difference in the electric potential therebetween. Then, after reading or writing comes to an end, the data lines are precharged and equalized to the initial electric potential. Therefore, when the electric potentials of the data lines CD0, CD1, CD2, CD3 change, the electric power is invariably consumed. A good deal of electric power consumption needed to the disadvantage of miniaturizing the semiconductor integrated element, and is also an obstacle to an increase in speed.

SUMMARY OF THE INVENTION

It is a primary object of the present invention to provide a semiconductor memory device having a construction adapted to a block write mode, and capable also of reducing the electric power consumption to the greatest possible degree by decreasing charges and discharges of futile data lines as much as possible in the case of a typical 1-bit read/write.

According to the present invention, there is provided a semiconductor memory device comprising:

a plurality of column lines;

a plurality of memory cells connected respectively to said column lines;

a predetermined number of data lines provided corresponding to said memory cells, unitized by predetermined numbers, to which writings are simultaneously effected during a block write mode;

connecting means for selectively connecting said column lines to said data lines at interfaces between said column lines and said data lines corresponding thereto;

a connection control means for controlling said connecting means to connect all of said predetermined number of column lines to said data lines corresponding thereto during said block write mode and to connect only some of said predetermined number of column lines to said data lines corresponding thereto during other mode.

According to the present invention, the control means controls the connecting means, whereby the number of connections between the column lines and the data lines varies depending on a mode for simultaneously accessing a plurality of column lines as in a block write mode and a mode for accessing a single column line. The number of data lines in which a charge and discharge take place in the case of accessing the single column line is thereby reducible to the greatest possible degree as compared with the mode for simultaneously accessing the plurality of column lines. This in turn leads to a decrease in the electric power consumption. Besides, it is feasible to freely determine the writing or non-writing per column and the contents of the writing per column even in the block write mode.

BRIEF DESCRIPTION OF THE DRAWINGS

Other objects and advantages of the present invention will become apparent during the following discussion taken in conjunction with the accompanying drawings, in which.

DETAILED DESCRIPTION OF THE PREFERRED EMBODIMENTS

Figure 1:
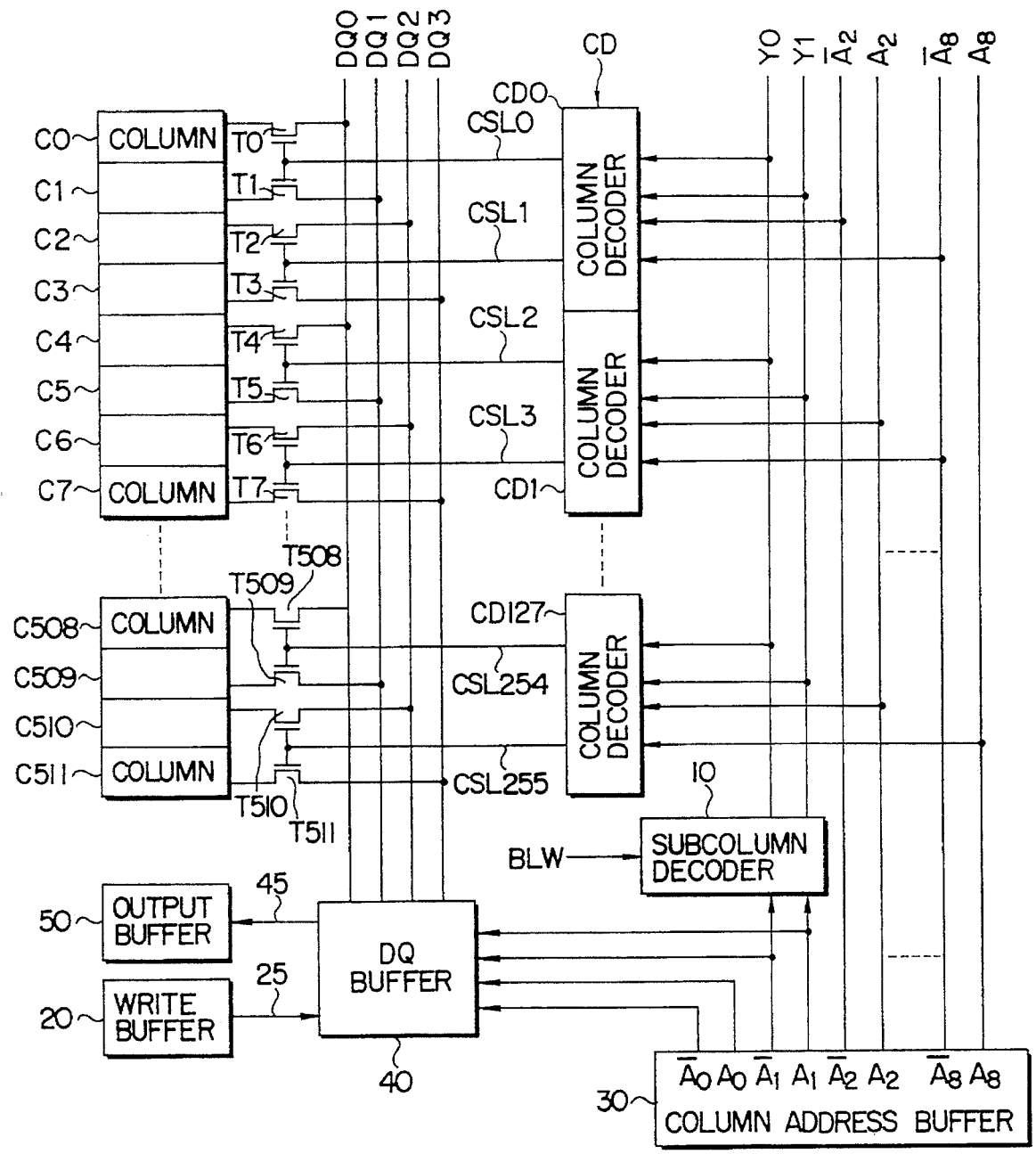
FIG. 1 is a block diagram depicting a construction of a first embodiment of the present invention.

FIG. 1 shows the construction of a first embodiment of a semiconductor memory device according to the present invention. The semiconductor memory device in this embodiment includes: a subcolumn decoder 10; a write buffer 20; a column address buffer 30; a DQ buffer 40; an output buffer 50; a random access memory module (hereinafter abbreviated to RAM module) consisting of 512 columns Ci ($i=0, \ldots 511$); 512 pieces of transfer gate transistors Ti ($i=0, \ldots 511$); four sets of data lines DQ0, DQ1, DQ2, DQ3; 256 column selection lines CSLi ($i=0, \ldots 255$); and a column decoder module CD. The write buffer 20, the column address buffer 30, the DQ buffer 40 and the output buffer 50 have already been described in the item of related background art, and the detailed explanations thereof will be omitted.

Figure 2:
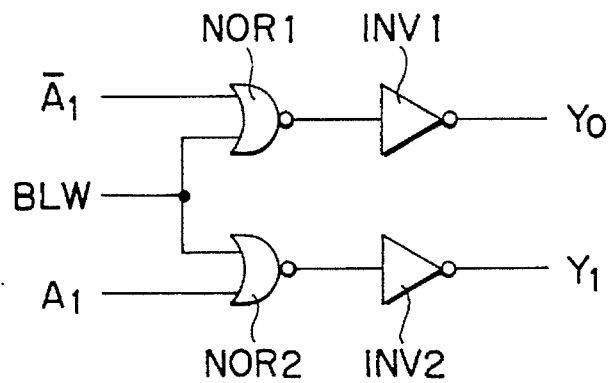
FIG. 2 is a circuit diagram illustrating a configuration of a subcolumn decoder in the first embodiment.

The subcolumn decoder 10 generates subaddress signals Y0, Y1 on the basis of a second bit value A1 from the low-order of column addresses A8, A7, ... A1 A0, an inverted bit value $\overline{A1}$ thereof and a block write signal BLW. FIG. 2 illustrates one constructive example of the subcolumn decoder 10. The decoder 10 is constructed of: two NOR circuits, i.e., an NOR gate NOR1 to which inverted bit value $\overline{A1}$ and the block write signal BLW are inputted and a NOR circuit NOR2 to which the bit value A1 and the block write signal BLW are inputted; and two inverter circuits INV1, INV2 for generating outputs Y0, Y1 by inverting the outputs thereof. The block write signal BLW is a signal which assumes a high potential during only a block write mode. Therefore, the subaddress signals Y0, Y1 output from the subcolumn decoder 10 both assume the high potential during the block write mode. In a mode other than the block write mode, the subaddress signal A1 has a value equal to the bit value A1, while Y0 has an inverted value thereof.

Figure 3:
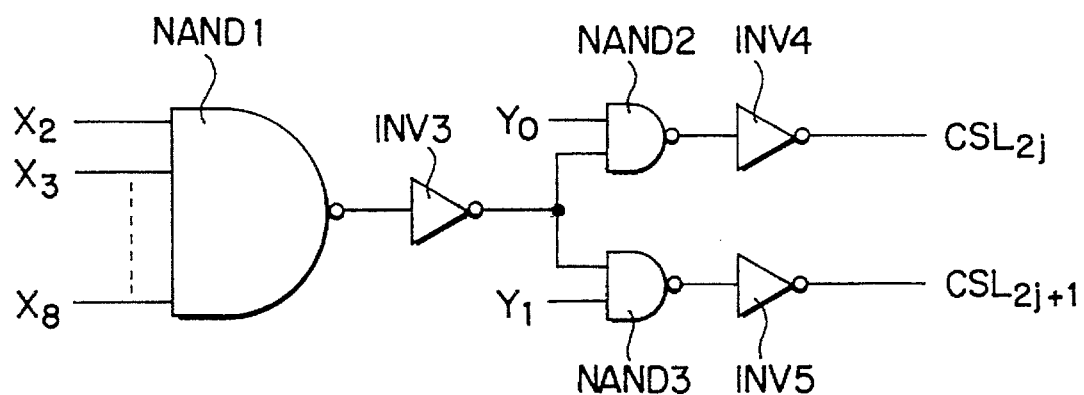
FIG. 3 is a circuit diagram showing a configuration of a column decoder in the first embodiment.

The column decoder module CD includes 128 pieces of column decoders CD0, ... CD127. FIG. 3 illustrates one example of the individual decoder CDj ($j=0 \ldots 127$). This circuit is provided with: a NAND circuit NAND1 to which respective values of outputs X8 ... X2 of the column address buffer 30 are input; NAND circuits NAND2 and NAND3 to which an inverted signal of the output of NAND 1 by the inverter circuit INV3 is input in common and the subaddress signals Y0, Y1 defined as outputs of the subcolumn decoder 10 are respectively input; and inverters INV4, INV5 for outputting column selecting signals with respect to CSL2j, CSL2j+1 by inverting the outputs thereof.

In this circuit, the column selection lines CSL2j, CSL2j+1 are selected based on the outputs X8 ... X2 of the column address buffer 30 as well as on the outputs Y0, Y1 of the subcolumn decoder 10. The symbol Xi herein represents a bit value Ai of the column address or an inverted value Ai thereof. Hence, the individual column decoder CDj selects the two column selection lines CSL2j, CSL2j+1 if the outputs Xi ($i=2, \ldots 8$) of the column address buffer 30 are all equal to "1" in the case of the block write mode. The column decoder CDj selects one of two column selection lines CSL2j, CSL2j+1 in accordance with the output of the subcolumn decoder 10 if the outputs Xi (i=2, ... 8) are all equal to "1" in the case of a mode (1-bit read/write mode) other than the block write mode. The column decoder CDj does not select the column selection lines CSL2j, CSL2j+1 if the output Xi (i=2, ... 8) are all unequal to "1".

Respective selecting lines CSLi (i=0, ... 255) are connected to corresponding gates of the respective transfer gates T2i, T2i+1 of columns C2i, C2i+1 of the RAM module.

The individual transfer gates Ti (i=0, ... 511) are for transferring the data between the data lines DQj and the columns Ci of the RAM module on the assumption that j is the remainder when the number i is divided by 4.

The DQ buffer 40 drives four sets of data lines DQ0, DQ1, DQ2, DQ3 during the block write mode and also drives either two sets of data lines DQ0, DQ1 or two sets of data lines DQ2, DQ3 during the 1-bit read/write mode.

The following is an explanation about the operation of this embodiment. When giving the column addresses A8 .. . A1A0, one column decoder CDj among 128 pieces of column decoders D0, ... CD127 is selected based on high-order 7-bit subaddresses A8 ... A2.

Now, considering the block write mode, i.e., the case where BLW ="1", the values of the output signals Y0, Y1 of the subcolumn decoder 10 are both "1". Therefore, the selected column decoder CDj selects the two column selection lines CSL2j, CSL2j+1. The transfer gate transistors T4j, T4j+1, T4j+2, T4j+ are thereby turned ON. The data transmitted from the DQ buffer 40 through the data lines DQ0, DQ1, DQ2, DQ3 are written to memory cells of the columns C4j, C4j+1, C4j+2, C4j+ of the RAM module.

Furthermore, in the case of the 1-bit read/write mode, one of the values of the output signals Y0, Y1 of the subcolumn decoder 10 is "1", while the other is "0". Accordingly, the selected column decoder Cdj selects one of the column selection lines C2j, C2j+1 in accordance with the values of the signals Y0, Y1. If, e.g., the column selection line C2j is selected, the transfer gates T4j, T4j+1 are turned ON, thereby writing or reading the data to or from the memory cells of the columns C4j, C4j+1 of the RAM module. At this moment, the DQ buffer 40 drives the data lines Q0, DQ1 on the basis of the values of the low-order 2 bits of the column addresses A8 ... A1 A0. Note that the DQ buffer 40 drives the data lines DQ2, DQ3 when selecting the column selection line C2j+1.

As discussed above, there are two sets of data lines in which a charge and discharge take place during the 1-bit read/write mode. This can be reduced by a factor of 2 as compared with the block write mode, whereby the electric power consumption can be decreased to the greatest possible degree.

Figure 4:
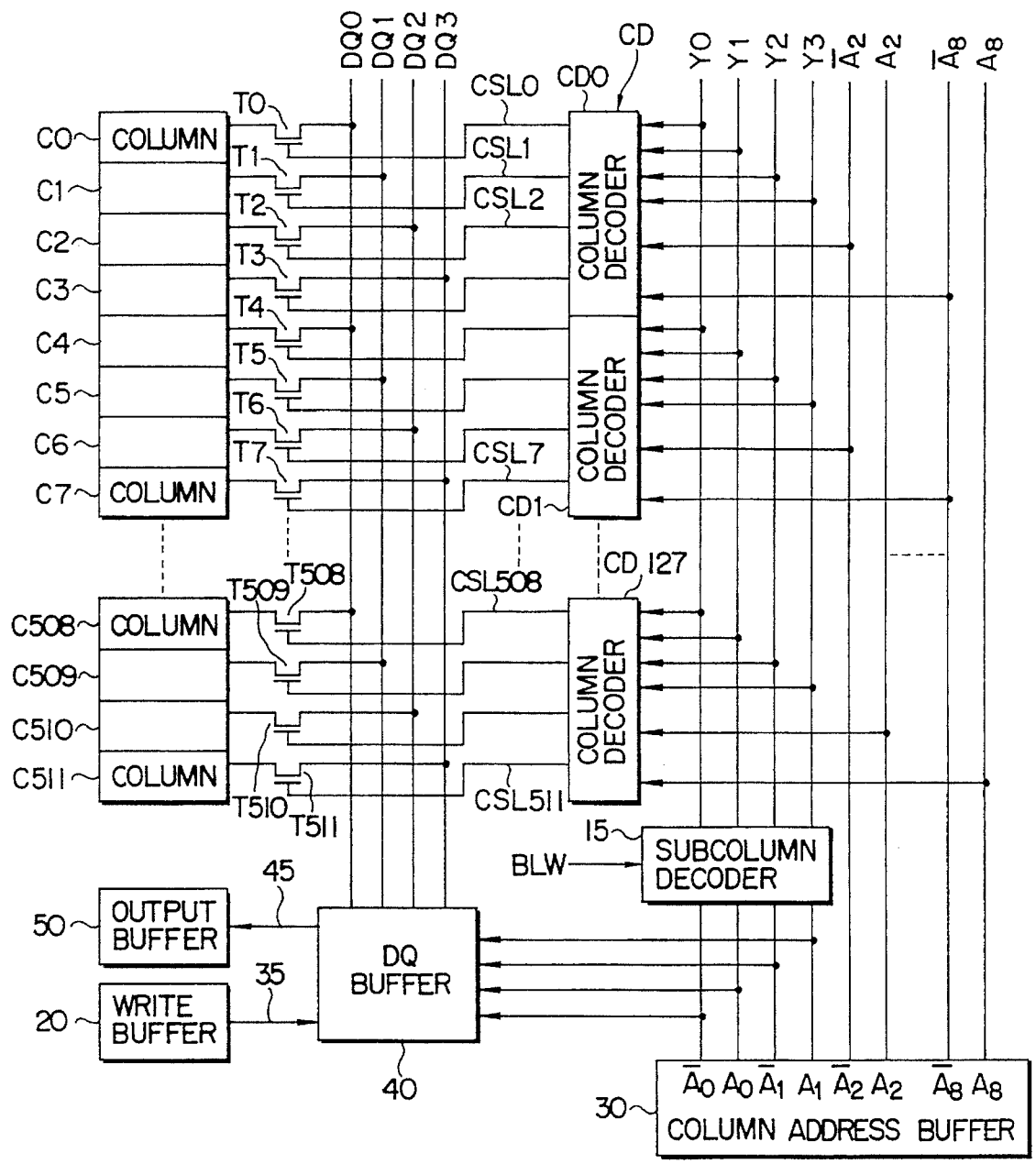
FIG. 4 is a block diagram depicting construction of a second embodiment of the present invention.

Next, a second embodiment of the present invention will be described with reference to FIG. 4. Only a subcolumn decoder 15, a DQ buffer 40, a column decoder module CD and column selection lines CSLj (j=0, ... 511) are different components of the semiconductor memory device in the second embodiment from those of the semiconductor memory device in the first embodiment. These different components will be described.

The subcolumn decoder 15 generates subaddress signals Yj (j=0, ... 3) on the basis of the values of the low-order 2 bits A1, A0 among the column addresses A8 ... A1 A0 and the block write signal. To be more specific, during the block write mode, i.e., when BLW ="1", the values of subaddress signals Yj are all set to "1". During a mode other than the block write mode, i is defined such as:

$$i = A1 \cdot 2 + A0$$

Figure 5:
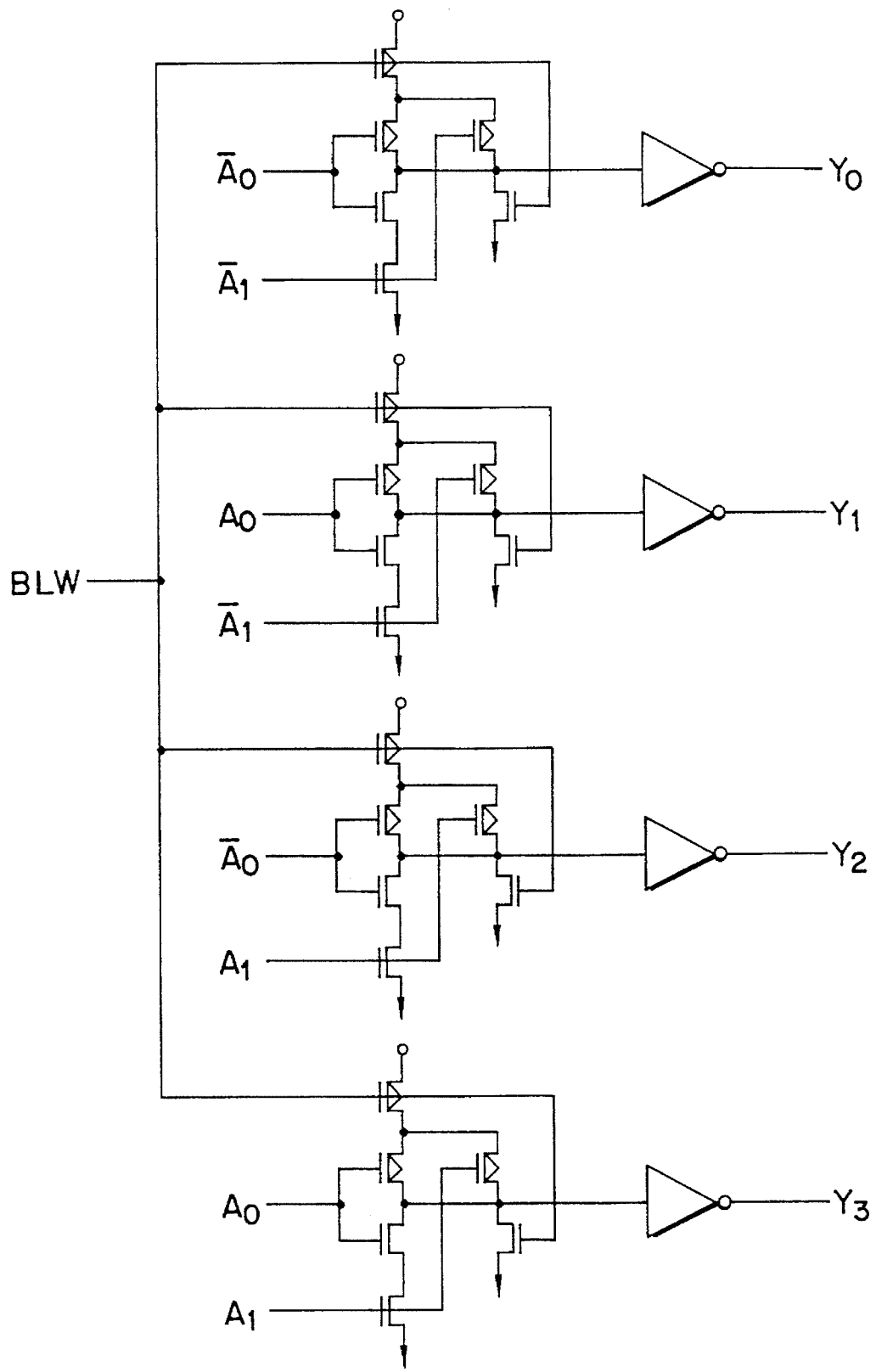
FIG. 5 is a circuit diagram illustrating a configuration of the subcolumn decoder of the second embodiment.
Figure 6:
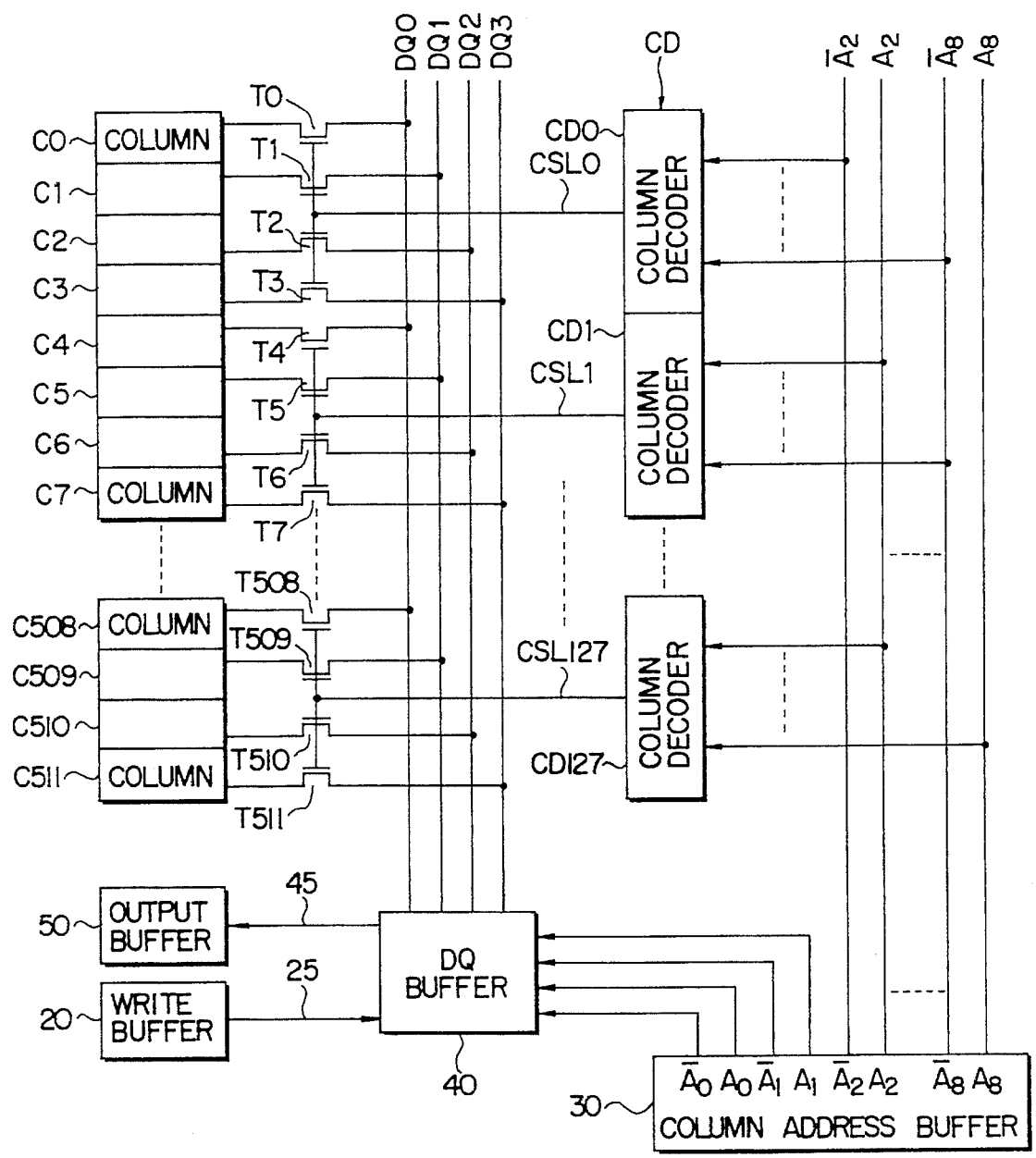
FIG. 6 is a block diagram showing construction of a conventional semiconductor memory device.
Figure 7:
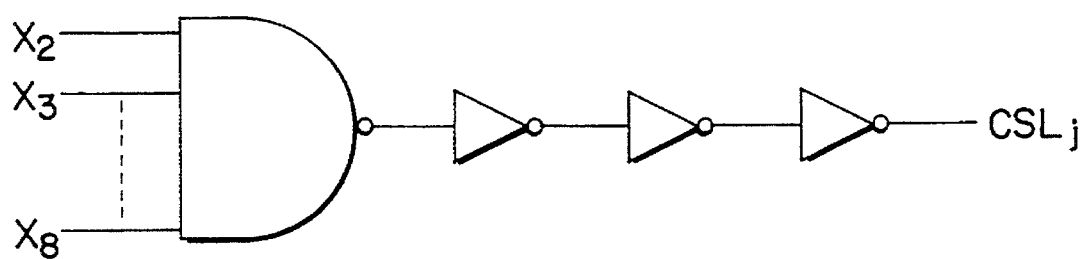
FIG. 7 is a circuit diagram illustrating a configuration of the column decoder in a conventional semiconductor memory device.

Then, only the subaddress signal Yi is set to "1", while other subaddress signals Yj (j≠i) are set to "0". FIG. 5 shows one example of this configuration.

The column decoder module CD is composed of 128 pieces of column decoders CD0, ... CD127. A single piece of column decoder CDj is selected based on the subaddresses A8 ... A2 exclusive of the low-order 2 bits among the column addresses A8, A7 ... A0. Then, this selected column decoder CDj selects four column selection lines CSL4j, CSL4j+1, CSL4j+2, CSL4j+ during the block write mode on the basis of the output of the subcolumn decoder 15. During a mode other than this mode, the column decoder CDj selects one of the four column selection lines CSL4j, CSL4j+1, CSL4j+2. CSL4j+3. For example, during the mode except the block write mode, if the subaddress that becomes "1" is Yi, the column selection line CSL4j+i is selected.

The respective column selecting lines CSLj (j=0, ... 511) are connected to gates of the transfer gate transistors Tj.

The DQ buffer 40 drives four sets of data lines DQ0, DQ1, DQ2, DQ3 during the block write mode. The DQ buffer 40 drives one set of data lines among the four sets of data lines DQ0, DQ1, DQ2, DQ3 on the basis of the low-order 2-bit values A1, A0 of the column addresses A8 ... A0 during a mode other than that mode.

As described above, in accordance with the second embodiment, during the mode other than the block write mode, namely, during the 1-bit read/write mode, only one set of data lines among the four sets of data lines are charged with electricity and discharged. The electric power consumption can be thereby reduced as much as possible.

It is to be noted that the first and second embodiments have given the description wherein the number of I/O bit is set to 1 for simplicity thereof. The present invention is not, however, limited to this. The degree of reducing the electric power consumption increases with a larger number I/O bits.

As discussed above, according to the present invention, the electric power consumption can be greatly decreased during the ordinary 1-bit read/write mode.

Although the illustrative embodiments of the present invention have been described in detail with reference to the accompanying drawings, it is to be understood that the present invention is not limited to those embodiments. Various changes or modifications may be effected by one skilled in the art without departing from the scope or spirit of the invention.

What is claimed is:

1. A semiconductor memory device operable in a first mode and a second mode, comprising:

a memory cell array having a plurality of memory cells arranged in a matrix form and having a plurality of column lines connected to the memory cells in a same column, said memory cells and said column lines being divided into a plurality of column blocks;

a plurality of data lines;

a plurality of switch means each connected between a corresponding one of the column lines and one of the data lines;

a column address buffer circuit for generating a first group of address signals and a second group of address signals;

a buffer circuit connected to the plurality of data lines, said buffer circuit receiving the first group of address signals and selectively amplifying data on the data lines;

a first column decoder circuit configured to receive the first group of address signals and to generate subaddress signals, said subaddress signals being partially activated in the first mode and being wholly activated in the second mode; and a second column decoder circuit configured to receive the subaddress signals and the second group of address signals and to generate column selection signals for controlling said plurality of switch means.

2. The semiconductor memory device according to claim 1, wherein the first column decoder circuit receives a control signal having a first state in the first mode and a second state in the second mode.

3. The semiconductor memory device according to claim 2, wherein the first mode is a block write mode and the second mode is a mode other than the block write mode.

4. The semiconductor memory device according to claim 1, further comprising:

an output buffer circuit for further amplifying data selectively amplified by said buffer circuit; and a write buffer circuit for receiving externally provided write data and for transferring the write data to said buffer circuit.

5. The semiconductor memory device according to claim 1, wherein said second column decoder circuit comprises:

a first section for decoding the second group of address signals and for generating a selection signal; and a second section for receiving said selection signal and said subaddress signals to generate column selection signals, said column selection signals being transferred to said switch means.

6. The semiconductor memory device according to claim 5, wherein said second section comprises:

a first logical product gate for generating a first column selection signal from the selection signal and one of the first group of address signals; and a second logical product gate for generating a second column selection signal from the selection signal and another one of the first group of address signals.

7. The semiconductor memory device according to claim 1, wherein said first column decoder circuit comprises:

a first logical sum gate for receiving the control signal and one of the first group of address signals and for generating a first subaddress signal; and a second logical sum gate for receiving the control signal and another one of the first group of address signals and for generating a second subaddress signal.

8. The semiconductor memory device according to claim 1, wherein said first column decoder comprises four logical gates for receiving a common block write signal and four possible combinations of logic levels of a lowest two bits of the first group of address signals and for generating four subaddress signals, only one of the four subaddress signals indicates a first level and an other three of the four subaddress signals indicate a second level when the second mode is designated.

9. The semiconductor memory device operable in a first mode and a second mode, comprising:

a memory cell array having a plurality of memory cells arranged in a matrix form and having a plurality of bit line pairs, the memory cells in a same column being connected to a corresponding one of the bit line pairs, the plurality of bit line pairs being divided into a plurality of first groups each having N bit line pairs, each of the first groups being divided into a plurality of second groups each having M bit line pairs;

a data bus having N data line pairs, each of the N data line pairs corresponding to a different one of the bit line pairs in the first groups;

a plurality of switch means each connected between a bit line pair and a corresponding data line pair;

a plurality of column select lines each connected to a switch means in one of the second groups;

a buffer circuit connected to the data bus for amplifying data on the data bus; and decoding means for receiving address signals and for selectively activating the column select lines, the decoding means activating the column select lines belonging to one of the first groups in the first mode, and activating the column select lines belonging to one of the second groups in the second mode.

10. The semiconductor memory according to claim 9, further comprising partial decoding means for receiving a first group of address signals and for generating subaddress signals, said subaddress signals being partially activated in the first mode and being wholly activated in the second mode, and said subaddress signals being supplied to said decoding means.

11. The semiconductor memory according to claim 10, further comprising a column address buffer circuit for generating the first group of address signals and a second group of address signals, said first group of address signals being supplied to said partial decoding means and said second group of address signals being supplied to said decoding means.

12. The semiconductor memory according to claim 9, further comprising:

an output buffer circuit for further amplifying data selectively amplified by said buffer circuit; and a write buffer circuit for receiving externally provided write data and for transferring the write data to said buffer circuit.

13. The semiconductor memory device according to claim 9, wherein said partial decoding means comprises:

a first logical sum gate for receiving the control signal for designating either the first mode or the second mode and one of the first group of address signals, and for generating the first subaddress signal; and a second logical sum gate for receiving the control signal and another of the first group of address signals, and for generating a second subaddress signal.

14. The semiconductor memory device according to claim 10, wherein the first mode is a block write mode and the second mode is a mode other than the block write mode.

15. The semiconductor memory device according to claim 9, wherein each of said column select lines is commonly connected to said switch means that are connected to each of the second groups.

16. The semiconductor memory device according to claim 10, wherein said column decoding means comprises four logical gates for receiving a common block write signal and four possible combinations of logic levels of a lowest two bits of the first group of address signals and for generating four activated subaddress signals when the first mode is designated by the control signal, and for generating four subaddress signals, only one of which being activated, when the second mode is designated.

17. The semiconductor memory device according to claim 11, wherein said buffer circuit receives the first group of address signals and selectively amplifies data on the data lines in response to the first group of address signals.

18. A method for reading data stored in a dynamic random access memory which includes a memory cell array having a plurality of memory cells arranged in a matrix form and a plurality of bit line pairs, wherein the memory cells are grouped in first groups and each of the first groups includes a plurality of second groups, each of the first groups having N bit line pairs and each of the second groups having M bit line pairs, and N data line pairs for transmitting the data from the memory cell array to a data buffer circuit via a data bus, the method comprising the steps of:

a) in a first mode, activating the N data line pairs and transmitting N bits of data from the memory cell array to the data buffer circuit; and b) in a second mode, activating M data line pairs and transmitting M bits of data from the memory cell array to the data buffer circuit.

19. The method according to claim 18, further comprising the step of amplifying data on the data bus.

20. A method for writing data stored in a dynamic random access memory which includes a memory cell array having a plurality of memory cells arranged in a matrix form and a plurality of bit line pairs, wherein the memory cells are grouped in first groups and each of the first groups includes a plurality of second groups, each of the first groups having N bit line pairs and each of the second groups having M bit line pairs, and N data line pairs for transmitting the data from the memory cell array to a data buffer circuit via a data bus, the method comprising the steps of:

a) in a first mode, activating the N data line pairs and transmitting N bits of data from the data buffer circuit to the memory cell array; and b) in a second mode, activating M data line pairs and transmitting M bits of data from the data buffer circuit to the memory cell array.

21. The method according to claim 20, further comprising the step of amplifying data on the data bus.

\* \* \* \* \*